(12) United States Patent
Kawahara et al.

(10) Patent No.: US 11,691,533 B2
(45) Date of Patent: Jul. 4, 2023

(54) JIG FOR CONNECTOR CURRENT EVALUATION

(71) Applicant: TOYOTA JIDOSHA KABUSHIKI KAISHA, Toyota (JP)

(72) Inventors: Hisato Kawahara, Toyota (JP); Hiroaki Yuasa, Miyoshi (JP); Hidetoshi Kusumi, Nagoya (JP); Kyoko Inayoshi, Nukata-gun (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 17/728,171

(22) Filed: Apr. 25, 2022

(65) Prior Publication Data

US 2022/0242266 A1 Aug. 4, 2022

Related U.S. Application Data

(63) Continuation of application No. 17/117,836, filed on Dec. 10, 2020, now Pat. No. 11,338,696.

(30) Foreign Application Priority Data

Jan. 10, 2020 (JP) .................................. 2020-003141

(51) Int. Cl.
*B60L 53/62* (2019.01)
*B60L 53/16* (2019.01)

(52) U.S. Cl.
CPC ............... *B60L 53/62* (2019.02); *B60L 53/16* (2019.02)

(58) Field of Classification Search
CPC .................................. B60L 53/62; B60L 53/16
USPC ......................................................... 320/109
See application file for complete search history.

(56) References Cited

U.S. PATENT DOCUMENTS

| 8,018,233 | B2* | 9/2011 | Iwanaga | H01M 10/4207 |
| | | | | 429/231.95 |
| 8,138,747 | B2* | 3/2012 | Nishino | H01M 10/4285 |
| | | | | 324/426 |
| 11,148,534 | B2* | 10/2021 | Reber | H05K 7/20927 |
| 11,465,519 | B2* | 10/2022 | Zoon | B60L 53/16 |

(Continued)

FOREIGN PATENT DOCUMENTS

| CN | 102742091 B | * | 8/2015 | ......... H01R 13/5219 |
| CN | 113103871 A | * | 7/2021 | ............. B60L 1/006 |

(Continued)

*Primary Examiner* — Suresh Memula
(74) *Attorney, Agent, or Firm* — Oliff PLC

(57) ABSTRACT

An evaluation jig comprises a female terminal connectable to a male terminal of a charging connector. The female terminal includes a plurality of contact pieces and a support portion. Each contact piece has a flexible piece, and a contact portion protruding toward the center axis from an inner surface of the flexible piece. The flexible piece forms a portion of a cylinder having the center axis. The flexible piece has a length equal to or larger than twice an outer diameter of the cylinder in a direction parallel to the center axis. The flexible piece is elastically deformable so that the flexible piece has a distal end portion to be displaceable in a radial direction of the cylinder relative to a proximal end portion of the flexible piece. The contact portion has a shape curved so as to protrude inward in the radial direction.

7 Claims, 12 Drawing Sheets

(56) References Cited

U.S. PATENT DOCUMENTS

| | | | |
|---|---|---|---|
| 2009/0027056 A1* | 1/2009 | Huang | G01R 31/392 |
| | | | 320/132 |
| 2009/0195217 A1* | 8/2009 | Choi | B60W 20/13 |
| | | | 320/152 |
| 2010/0244782 A1* | 9/2010 | Nagayama | H02J 7/342 |
| | | | 180/65.29 |
| 2011/0316475 A1* | 12/2011 | Jung | H02J 50/12 |
| | | | 29/760 |
| 2012/0043935 A1* | 2/2012 | Dyer | B60L 50/40 |
| | | | 320/109 |
| 2012/0043943 A1* | 2/2012 | Dyer | B60L 53/302 |
| | | | 320/160 |
| 2012/0062385 A1* | 3/2012 | Wiesemann | H01R 13/717 |
| | | | 439/345 |
| 2012/0126747 A1* | 5/2012 | Kiko | B60L 53/16 |
| | | | 320/109 |
| 2012/0129378 A1* | 5/2012 | Kiko | B60L 53/31 |
| | | | 362/555 |
| 2012/0212179 A1* | 8/2012 | Nathan | B60L 53/16 |
| | | | 320/109 |
| 2019/0308519 A1 | 10/2019 | Tsukamoto | |
| 2019/0344674 A1 | 11/2019 | Arai | |
| 2021/0213841 A1* | 7/2021 | Kusumi | G01R 27/205 |
| 2021/0218255 A1* | 7/2021 | Kusumi | H01B 9/006 |

FOREIGN PATENT DOCUMENTS

| | | | | | |
|---|---|---|---|---|---|
| CN | 113103871 | A | | 7/2021 | |
| CN | 113112109 | A | | 7/2021 | |
| CN | 113112109 | A | * | 7/2021 | B60L 53/302 |
| CN | 113112110 | A | | 7/2021 | |
| CN | 113112110 | A | * | 7/2021 | B60L 53/16 |
| CN | 113112111 | A | * | 7/2021 | B60L 53/11 |
| CN | 113112111 | A | | 7/2021 | |
| CN | 113112112 | A | | 7/2021 | |
| CN | 113112112 | A | * | 7/2021 | B60L 53/11 |
| DE | 10 2018 105 506 | A1 | | 9/2019 | |
| EP | 2 905 844 | A1 | | 8/2015 | |
| EP | 3 584 889 | A1 | | 12/2019 | |
| EP | 3694057 | A1 | * | 8/2020 | H01R 13/40 |
| EP | 3848230 | A1 | | 7/2021 | |
| EP | 3848230 | A1 | * | 7/2021 | B60L 53/11 |
| EP | 3848231 | A1 | | 7/2021 | |
| EP | 3848231 | A1 | * | 7/2021 | B60L 53/11 |
| EP | 3848232 | A1 | * | 7/2021 | B60L 53/11 |
| EP | 3848234 | A1 | * | 7/2021 | B60L 53/16 |
| EP | 3848235 | A1 | * | 7/2021 | B60L 1/006 |
| EP | 3848236 | A1 | * | 7/2021 | B60L 53/302 |
| EP | 3582333 | B1 | * | 9/2022 | B60L 53/16 |
| JP | 2019-187035 | A | | 10/2019 | |
| JP | 2022039492 | A | * | 3/2022 | |

* cited by examiner

JIG FOR CONNECTOR CURRENT EVALUATION

This application is a continuation application of U.S. application Ser. No. 17/117,836, filed Dec. 10, 2020, the contents of which are incorporated herein by reference.

This nonprovisional application is based on Japanese Patent Application No. 2020-003141 filed on Jan. 10, 2020 with the Japan Patent Office, the entire contents of which are hereby incorporated by reference.

BACKGROUND

Field

The present disclosure relates to an evaluation jig.

Description of the Background Art

A connecting portion of a charging connector on the side of facilities and a charging inlet on the side of a vehicle generates heat due to contact resistance when a current passes therethrough. This is particularly remarkable when rapid charging is performed with a large current (for example of 400 A). Accordingly, a liquid-cooled type charging connector coolable with liquid such as water is known. For example, Japanese Patent Laying-Open No. 2019-187035 discloses a liquid-cooled type charging connector comprising a connector connectable to a vehicular inlet and a cooling mechanism capable of cooling the connector with a coolant (or cooling water).

SUMMARY

When such a charging connector as disclosed in Japanese Patent Laying-Open No. 2019-187035 varies in coolability, it affects a period of time taken to charge power. For example, a charging connector with relatively low coolability requires a longer charging time. Therefore, there is a need for appropriately evaluating, a charging connector in coolability.

An object of the present disclosure is to provide an evaluation jig capable of appropriately evaluating a charging connector in coolability.

In order to address the above issue, an evaluation jig comprising a pair of female terminals connectable to a pair of male terminals of a charging connector may be used to evaluate the charging connector in coolability (or a degree at which temperature increases at a connecting portion of the male terminal and the female terminal).

If the contact resistance between the male terminal and the female terminal when an evaluation is made varies whenever the evaluation is made, the evaluation provides an unreliable result. Accordingly, in evaluating coolability, it is preferable that prescribed contact resistance be reliably reproducible.

According to one aspect of the present disclosure, an evaluation jig comprises a female terminal connectable to a male terminal of a charging connector, the female terminal including a plurality of contact pieces which can each contact the male terminal and are spaced about a center axis, and a support portion that supports the plurality of contact pieces, the plurality of contact pieces each having a flexible piece having a shape extending from the support portion in a direction parallel to the center axis, and a contact portion protruding toward the center axis from an inner surface of the flexible piece, the flexible piece forming a portion of a cylinder having the center axis, the flexible piece having a length equal to or larger than twice an outer diameter of the cylinder in a direction parallel to the center axis, the flexible piece being elastically deformable so that the flexible piece has a distal end portion to be displaceable in a radial direction of the cylinder relative to a proximal end portion of the flexible piece serving as a connecting portion of the flexible piece and the support portion, the contact portion having a shape curved so as to protrude inward in the radial direction.

In the present evaluation jig, the flexible piece that has a length equal to or larger than twice the outer diameter of the cylinder in the direction parallel to the center axis is each less plastically deformable when the female terminal is repeatedly connected to and pulled out of the male terminal, and furthermore, each contact portion having a shape curved so as to protrude inward in the radial direction reliably contacts the male terminal. This allows prescribed contact resistance to be reliably reproduced and the charging connectors coolability to be evaluated appropriately.

Preferably, the contact portion has a shape extending in a direction parallel to the center axis.

Thus, even when the female terminal is connected to the male terminal in a state with the female terminal's center axis inclined relative to the male terminal's center axis, the female terminal is guided to have a posture so that the center axes match each other.

Furthermore, preferably, the flexible piece has a protruding portion protruding from the contact portion in a direction parallel to the center axis away from the support portion.

Furthermore, preferably, the flexible piece and the contact portion have a boundary portion therebetween in a curved shape.

In this case, the contact portion preferably has an apex smaller in curvature than the boundary portion.

Furthermore, preferably, the flexible piece has a facing surface facing a flexible piece adjacent to the flexible piece of interest in the circumferential direction of the cylinder, and any pan of such facing surfaces facing each other in the circumferential direction are parallel to each other.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
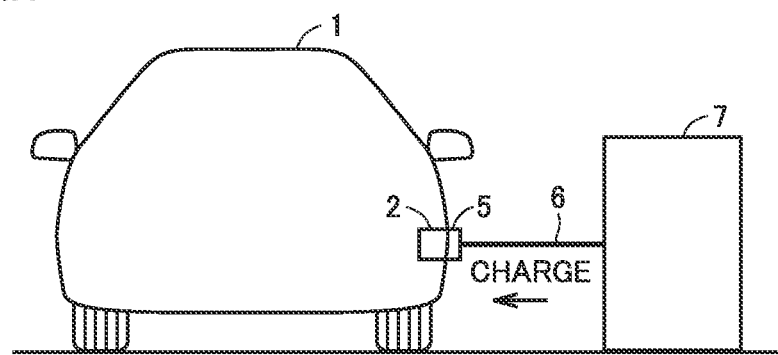
FIG. 1 is a diagram schematically showing a vehicle charged.

An Embodiment of the present disclosure will be described with reference to the drawings. In the drawings referred to below, identical or equivalent members are identically denoted.

FIG. 1 is a diagram schematically showing a vehicle charged. More specifically, FIG. 1 shows a state in which a charging connector 5 connected to a facility 7 such as a charging stand via a facility-side electric wire 6 is connected to a charging inlet 2 of a vehicle 1. Vehicle 1 is, for example, an electric vehicle.

Charging connector 5 includes a handle (not shown) held by a user, and a male connector 10 (see FIG. 2) connected to the handle. Charging connector 5 is cooled by a coolant. That is, charging connector 5 is a so-called liquid-cooled charging connector. An example of the coolant includes cooling water. The coolant flows between facility 7 and charging connector 5 via facility-side electric wire 6.

Figure 2:
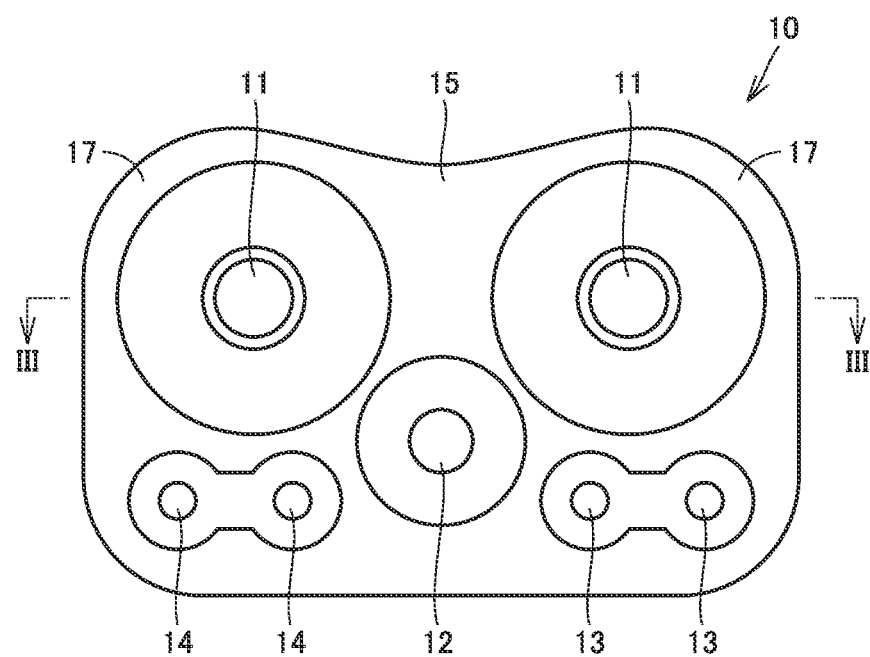
FIG. 2 is a front view of a male connector.

Male connector 10 is a portion connected to charging inlet 2 of vehicle 1. In the present embodiment, male connector 10 is based on the ChaoJi standard. As shown in FIG. 2, male connector 10 includes a pair of male terminals 11, a protective grounding terminal 12, a pair of charging connection confirmation terminals 13, a pair of charging communication terminals 14, and a male casing 15.

Each male terminal 11 is formed in a round column. Each male terminal 11 is a direct-current power supply terminal. One male terminal 11 is a positive electrode and the other male terminal 11 is a negative electrode. In the present embodiment, male terminal 11 has an outer diameter of 9 mm.

Protective grounding terminal 12 is disposed at a position spaced from a center portion between the paired male terminals 11 on one side in a direction orthogonal to both an imaginary line connecting the paired male terminals 11 (i.e., a lateral direction in FIG. 2) and an axis of each male terminals 11, that is, in a vertical direction in FIG. 2.

Each charging connection confirmation terminal 13 is disposed at a position spaced from one male terminal 11 on one side in the orthogonal direction.

Each charging communication terminal 14 is disposed at a position spaced from the other male terminal 11 on one side in the orthogonal direction and also spaced from each charging connection confirmation terminal 13 in a direction parallel to the imaginary line connecting the paired male terminals 11.

Male casing 15 holds terminals 11 to 14. Male casing 15 is made of resin. Male casing 15 has a bottom wall 16 and a tubular wall 17.

Figure 3:
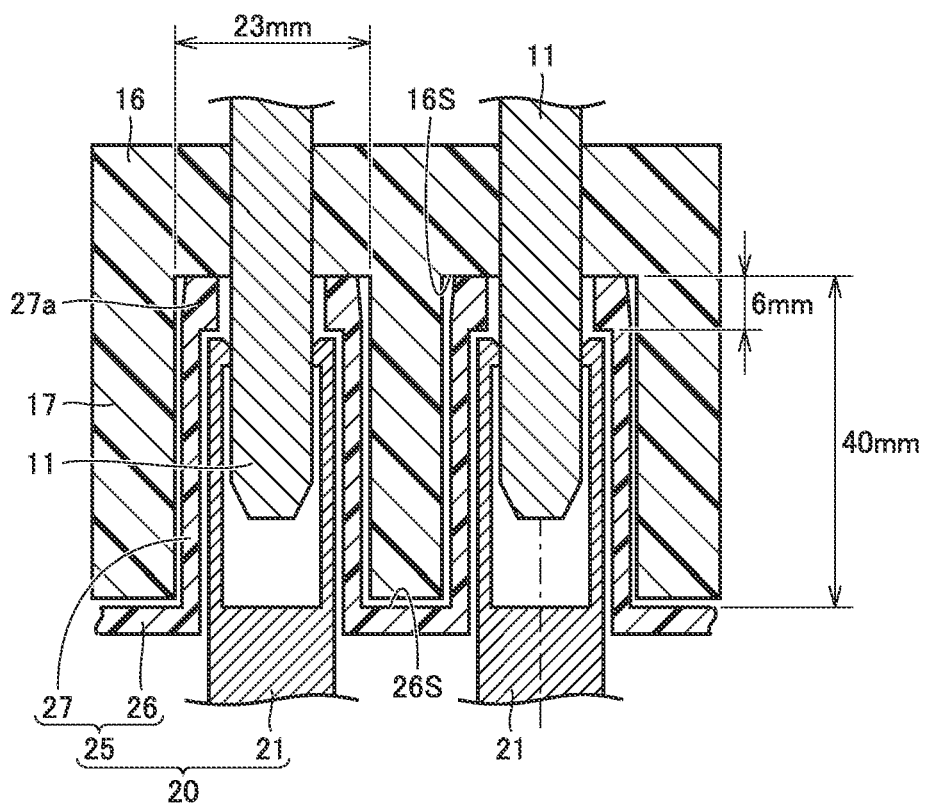
FIG. 3 is a cross section taken along a line III-III indicated in FIG. 2.

As shown in FIG. 3, bottom wall 16 holds terminals 11 to 14 in a state in which terminals 11 to 14 are inserted therethrough. Bottom wall 16 is formed in a flat plate. FIG. 3 shows a part of female connector 20 of charging inlet 2.

Tubular wall 17 surrounds male terminal 11. Tubular wall 17 erects from a portion of bottom wall 16 around male terminal 11. Tubular wall 17 has a cylindrical inner peripheral surface. Female connector 20 of charging inlet 2 is inserted into a space between the inner peripheral surface and an outer peripheral surface of male terminal 11. As shown in FIG. 3, tubular wall 17 has an inner diameter set to 23 mm.

Charging inlet 2 is provided on an external surface of vehicle 1. Charging inlet 2 includes female connector 20. Female connector 20 has a pair of female terminals 21 and a female casing 25.

Each female terminal 21 is connectable to male terminal 11. As shown in FIG. 3, each female terminal 21 has a shape capable of receiving male terminal 11.

Female casing 25 holds female terminals 21. Female casing 25 is made of resin. As shown in FIG. 3, female casing 25 has a facing portion 26 and a tubular portion 27.

Facing portion 26 is a portion facing tubular wall 17 in a direction parallel to the axial direction of male terminal 11 (i.e., a vertical direction in FIG. 3). Facing portion 26 has a surface 26S formed flat. As shown in FIG. 3, a distance between surface 26S of facing portion 26 and a surface 16S of bottom wall 16 in the direction parallel to the axial direction of male terminal 11 is set to 40 mm.

Tubular portion 27 is formed to have a cylindrical shape surrounding female terminal 21. Tubular portion 27 is connected to facing portion 26 in a posture such that tubular portion 27 has its center axis orthogonal to facing portion 26. Tubular portion 27 has an outer diameter smaller than the inner diameter of tubular wall 17. In a state with charging connector 5 connected to charging inlet 2, tubular portion 27 has a distal end portion 27a in contact with surface 16S of bottom wall 16. As shown in FIG. 3, distal end portion 27a has a length set to 6 mm in a direction parallel to the axial direction of tubular portion 27.

Figure 4:
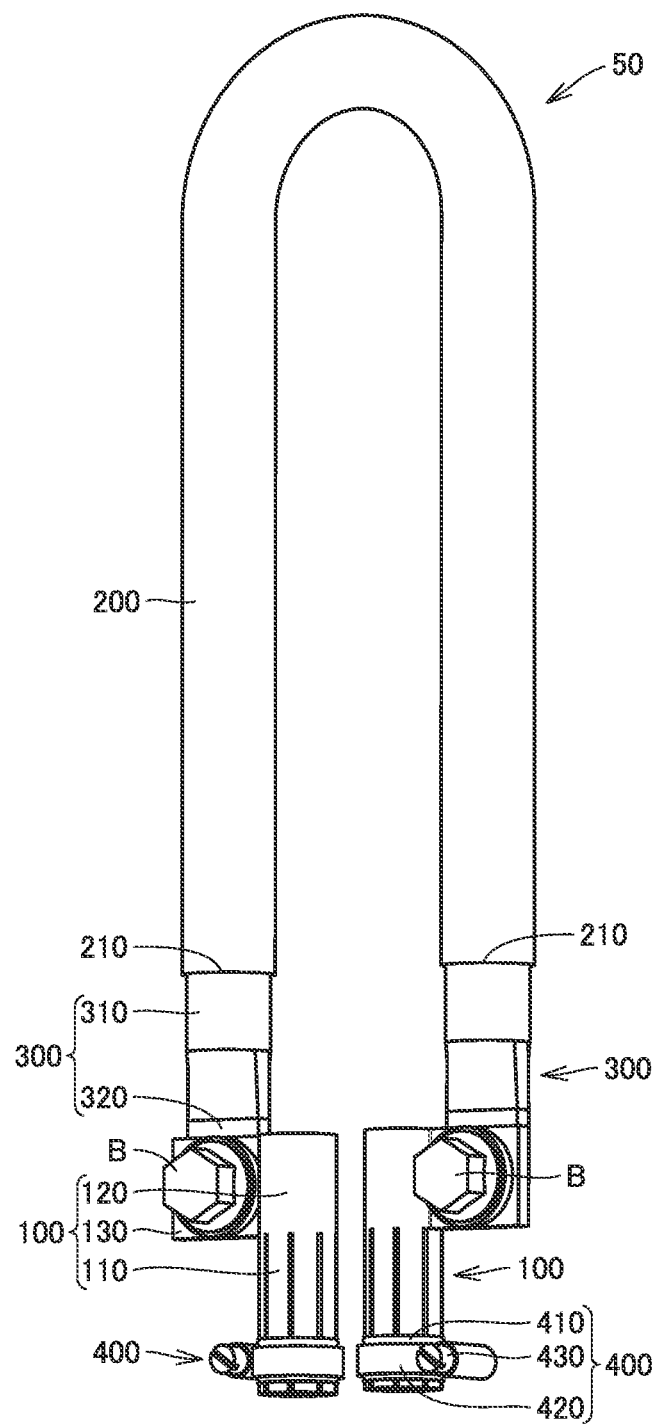
FIG. 4 is a perspective view of an evaluation jig according to an embodiment of the present disclosure.
Figure 5:
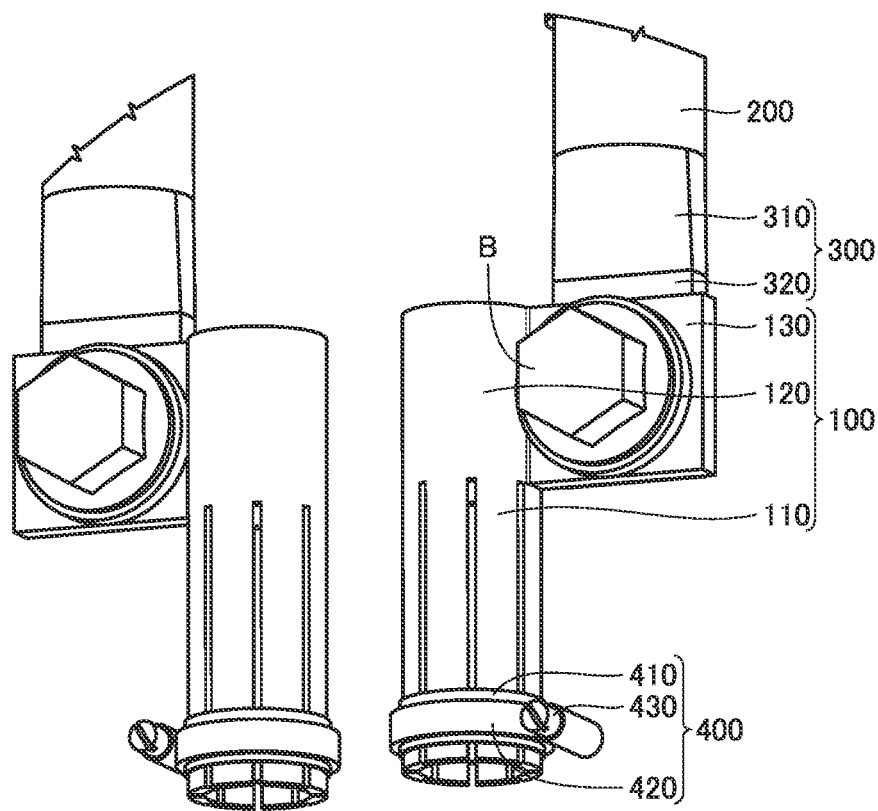
FIG. 5 is a perspective view M a vicinity of a female terminal of the evaluation jig.
Figure 6:
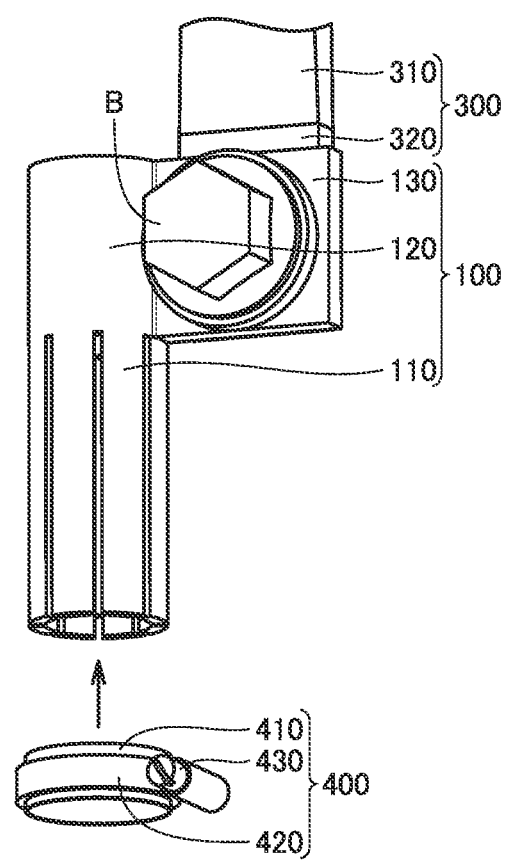
FIG. 6 is a perspective view showing a relationship between the female terminal of the evaluation jig and an adjustment member.

Hereinafter, evaluation jig 50 will be described with reference to FIGS. 4 to 13. Evaluation jig 50 is a jig capable of evaluating charging connector 5 in coolability (or amount of heat generated at a connecting portion of male terminal 11 and the female terminal). As shown in FIG. 4, evaluation jig 50 includes a pair of female terminals 100, an electric wire 200, a pair of crimp terminals 300, and a pair of adjustment members 400.

Each female terminal 100 is a terminal connected to male terminal 11. Each female terminal 100 includes a plurality of (eight in the present embodiment) contact pieces 110, a support portion 120, and a female-side flange 130.

Each contact piece 110 is a portion that can contact male terminal 11. The plurality of contact pieces 110 are disposed about and spaced from a center axis A (see FIGS. 11 to 13). Specifically, the plurality of contact pieces 110 are disposed about and equally spaced from center axis A. Contact pieces 110 are preferably set in number to 3 or more and 8 or less, particularly preferably 8. Each contact piece 110 has a flexible piece 112 and a contact portion 114.

Flexible piece 112 has a shape extending in a direction parallel to center axis A. Flexible piece 112 forms a portion of a cylinder having center axis A. In other words, in the cross sections shown in FIGS. 12 and 13, flexible piece 112 has an outer peripheral surface in the form of an arc. A slit 112S is provided between any pair of flexible pieces 112 adjacent in the circumferential direction of the cylinder.

In the direction parallel to center axis A, flexible piece 112 has a length L1 (see FIG. 7) set to be equal to or larger than twice the outer diameter of the cylinder. In the present embodiment, the cylinder has an outer diameter φ2 (see FIG. 11) of 17 mm, and flexible piece 112 has length L1 of 35 mm. The cylinder has an inner diameter φ1 (see FIG. 11) of 13 mm. That is, flexible piece 112 has a thickness of 2 mm.

Flexible piece 112 is elastically deformable such that flexible piece 112 has a distal end portion 112a displaced in the radial direction of the cylinder relative to a proximal end portion of flexible piece 112, which is a connecting portion of flexible piece 112 and support portion 120. That is, the plurality of contact pieces 110 (the cylinder) can be reduced in diameter.

Figure 12:
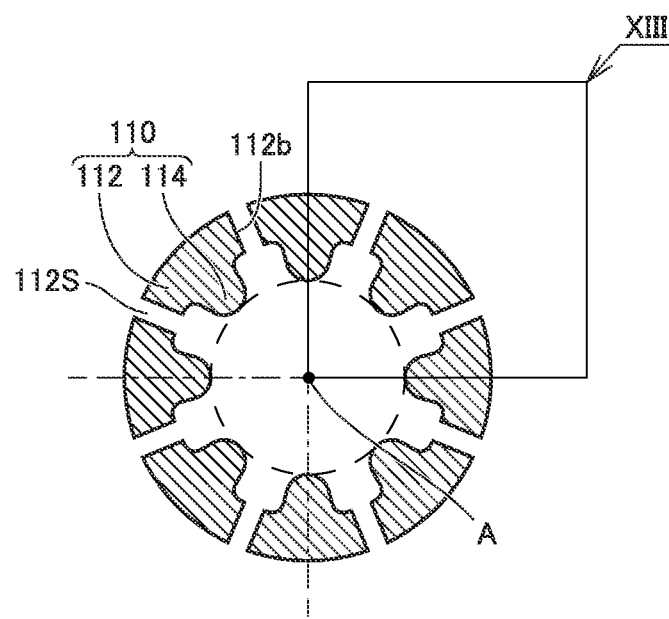
FIG. 12 is a cross section taken along a line XII-XII shown in FIG. 7.
Figure 13:
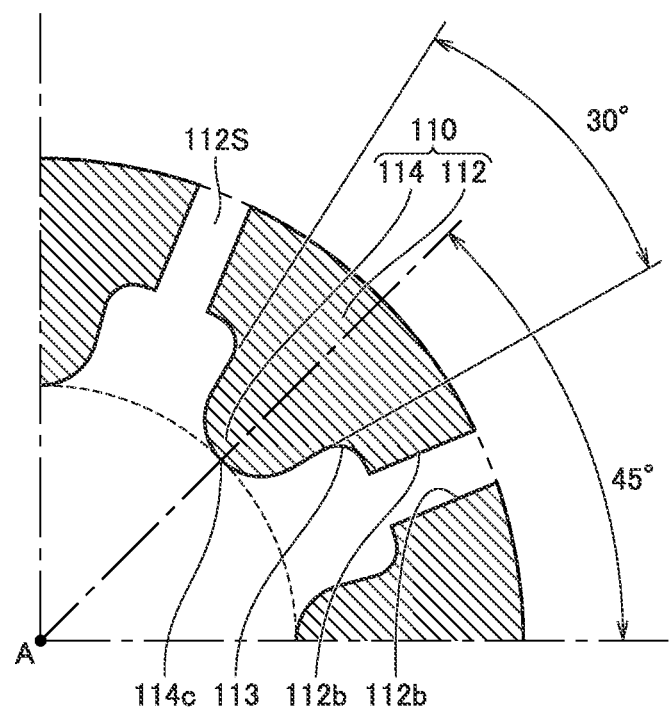
FIG. 13 is an enlarged view of a range indicated by a solid line XIII shown in FIG. 12.

As shown in FIGS. 12 and 13, flexible piece 112 has a facing surface 112b facing flexible piece 112 adjacent to flexible piece 112 of interest in the circumferential direction of the cylinder. Any pair of facing surfaces 112b facing each other in the circumferential direction are parallel to each other. The paired facing surfaces 112b are spaced by 1 mm.

Contact portion 114 has a shape protruding from the inner surface of flexible piece 112 toward center axis A. Contact portion 114 is connected to the inner surface of flexible piece 112 at a portion away from distal end portion 112a in the direction parallel to center axis A. That is, distal end portion 112a of flexible piece 112 configures a protruding portion protruding from contact portion 114 in the direction parallel to center axis A away from support portion 120 (or downward in FIG. 11).

Contact portion 114 has a shape curved so as to protrude inward in the radial direction. As shown in FIG. 13, flexible piece 112 and contact portion 114 have a boundary portion 113 therebetween in a curve. Contact portion 114 has an apex 114c with a curvature smaller than that of boundary portion 113. In the present embodiment, apex 114c has a radius of curvature of 1 mm. Boundary portion 113 has a radius of curvature for example of 0.5 mm.

As shown in FIG. 13, a straight line connecting a specific apex 114c and center axis A and a straight line connecting an apex 114c adjacent to the specific apex 114c and center axis A form an angle of 45 degrees. A tangent to an end on one side of contact portion 114 in the circumferential direction and a tangent to an end on the other side of contact portion 114 in the circumferential direction form an angle of 30 degrees.

Figure 10:
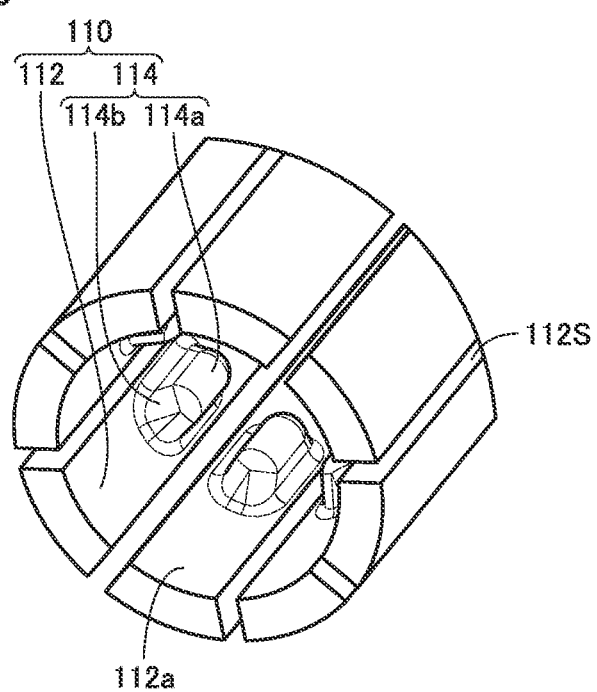
FIG. 10 is an enlarged perspective view of a distal end portion of the female terminal.
Figure 11:
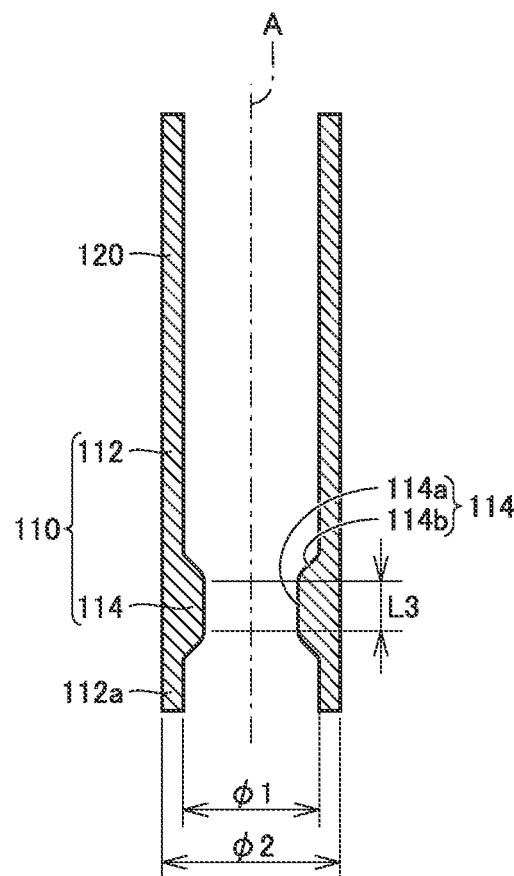
FIG. 11 is a cross section taken along a line XI-XI shown in FIG. 7.

Contact portion 114 has a shape extending in the direction parallel to center axis A. As shown in FIGS. 10 and 11, contact portion 114 has a contact edge portion 114a and a connecting portion 114b.

Contact portion 114 has a shape extending in the direction parallel to center axis A. Contact edge portion 114a has a length L3 of 4.7 mm.

Connecting portion 114b connects contact edge portion 114a and an inner surface of flexible piece 112. Connecting portion 114b has a shape inclined so as to gradually approach the inner surface of flexible piece 112 as connecting portion 114b is farther away from contact edge portion 114a in the direction parallel to center axis A. Connecting portion 114b and the inner surface of flexible piece 112 have a boundary portion therebetween with a radius of curvature of 0.5 mm. Connecting portion 114b and contact edge portion 114a have a boundary portion therebetween with a radius of curvature of 1.5 mm.

Support portion 120 supports the plurality of contact pieces 110. In the present embodiment, support portion 120 is formed to have a cylindrical shape having center axis A as a center. Support portion 120 has an outer peripheral surface contiguous to that of each flexible piece 112. That is, support portion 120 has an outer diameter equal to that of the cylinder composed of the plurality of flexible pieces 112.

Figure 7:
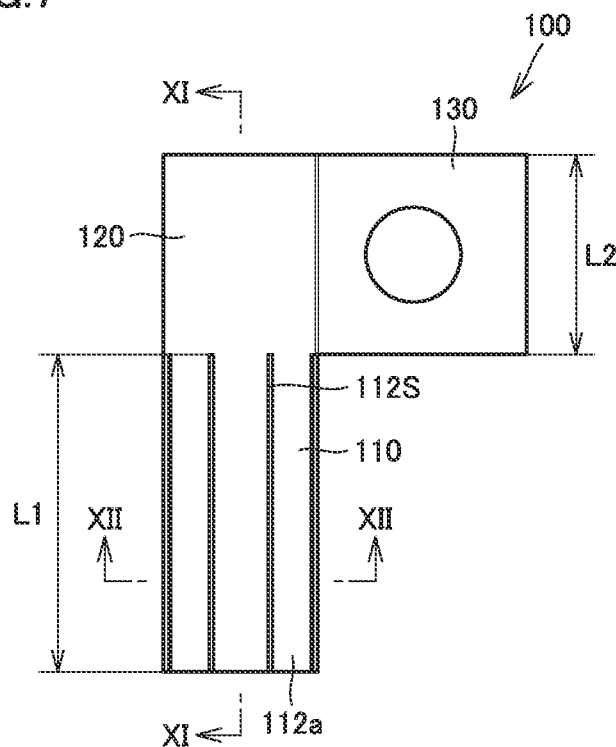
FIG. 7 is a plan view of the female terminal of the evaluation jig.
Figure 8:
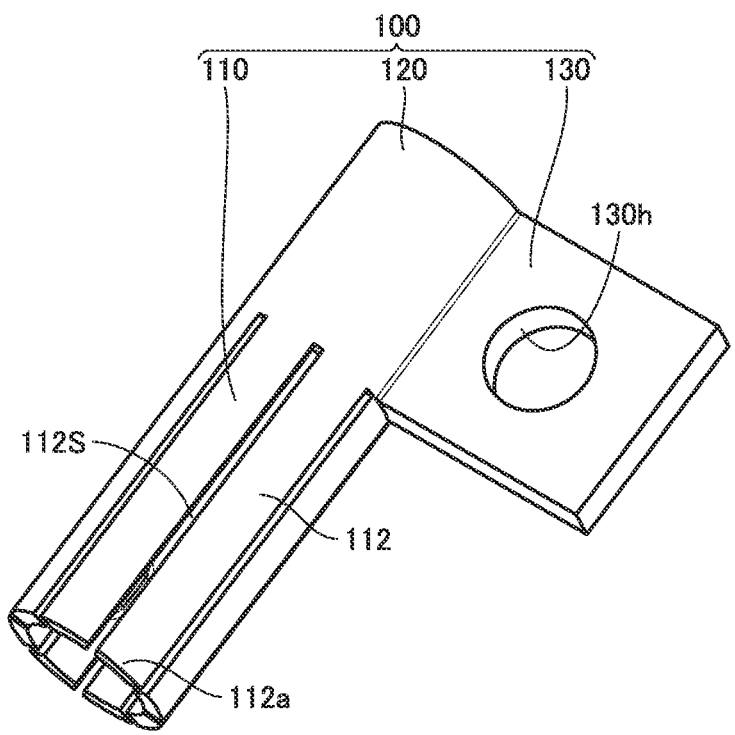
FIG. 8 is a perspective view of the female terminal shown in FIG. 7.
Figure 9:
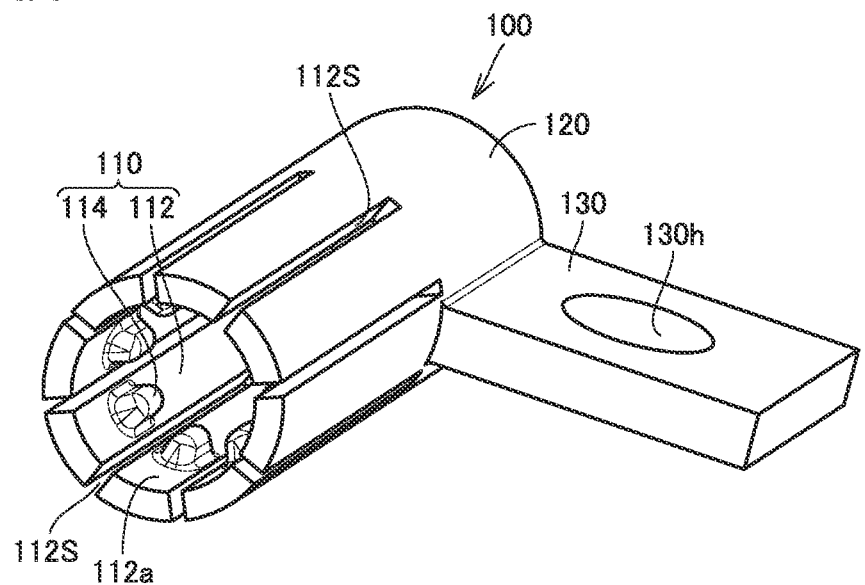
FIG. 9 is a perspective view of the female terminal at an angle different from that of FIG. 8.

As shown in FIG. 11, support portion 120 is equal in thickness to each flexible piece 112. As shown in FIG. 7, in a direction along center axis A, support portion 120 has a length L2 set to be smaller than length L1 of each flexible piece 112. Specifically, support portion 120 has length L2 of 22 mm. Support portion 120 may be formed in a round columnar shape, a rectangular columnar shape, or the like.

Female-side flange 130 has a shape projecting from an outer peripheral surface of support portion 120 outward in the radial direction of support portion 120. Female-side flange 130 is formed flat. In the direction parallel to center axis A, female-side flange 130 has a length equal to that of support portion 120 (22 mm in the present embodiment).

Female-side flange 130 is provided with an insertion hole 130h. Insertion hole 130h has a diameter of 10.5 mm. A distance between center axis A and the center of insertion hole 130h is 21 mm.

Electric wire 200 is provided to connect the paired female terminals 100 to each other. Electric wire 200 is made of copper or silver. Electric wire 200 preferably has a cross-sectional area set to 70 mm$^2$ or more and 95 mm$^2$ or less. In the present embodiment, electric wire 200 has a cross-sectional area set to 95 mm$^2$. Electric wire 200 has a length set to 2 m or more. The reason for this will be described with reference to FIG. 19.

Figure 19:
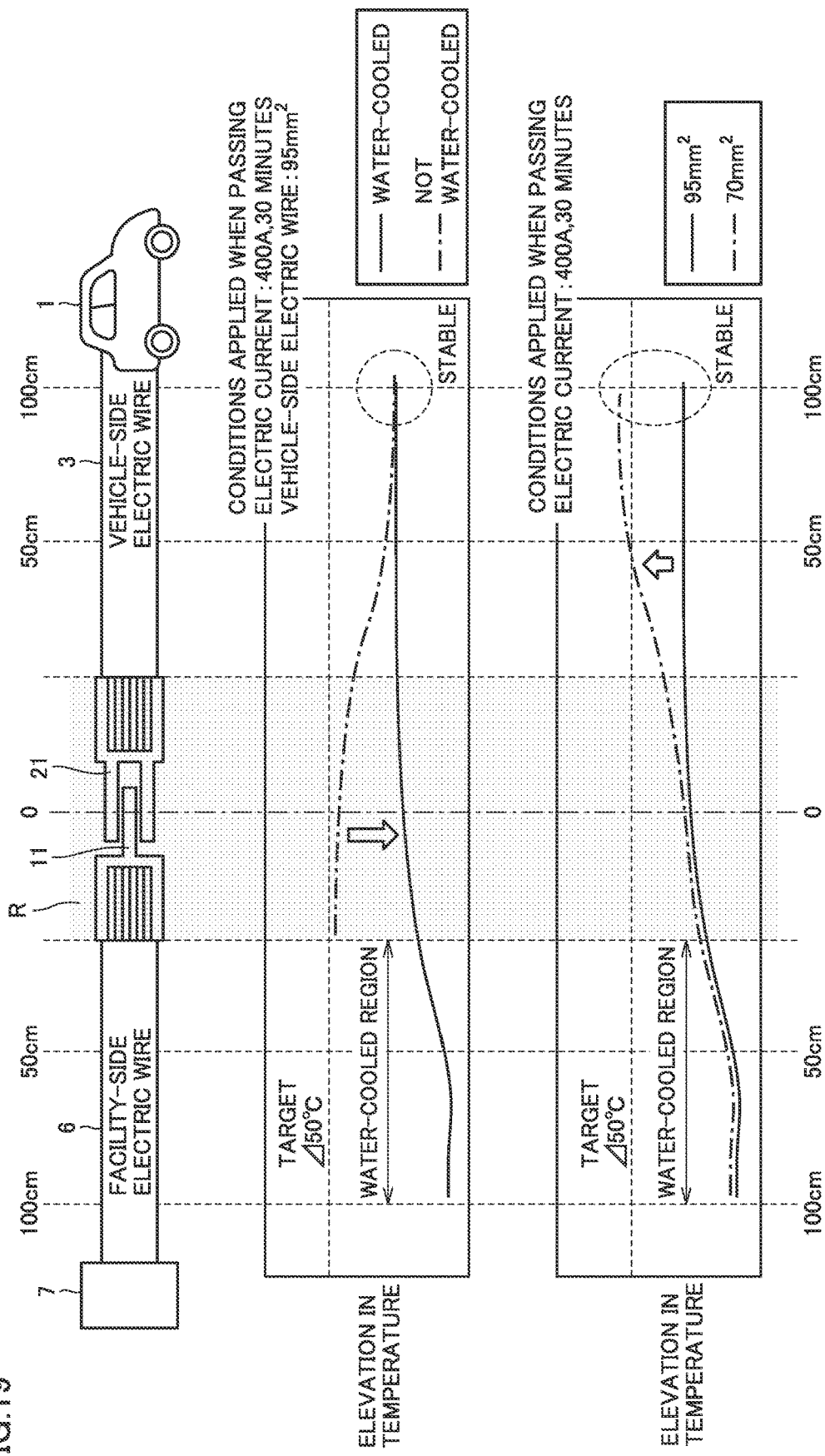
FIG. 19 is a diagram schematically showing a degree at which temperature rises at each portion around a connecting portion of a male terminal and a female terminal.

FIG. 19 represents each terminal and each electric wire in temperature when male terminal 11 is connected to female terminal 21 and a current of 400 A is supplied for 30 minutes. In FIG. 19, a region R of a connecting portion of male terminal 11 and female terminal 21 is a region which attains highest temperature.

As shown in FIG. 19, when a vehicle-side electric wire 3 has a cross-sectional area of 95 mm$^2$, and whether a portion up to 100 cm from male terminal 11 may or may not be cooled with water, it has been confirmed that a portion of vehicle-side electric wire 3 away from female terminal 21 by 100 cm is stable in temperature (or an effect of heat generated at the connecting portion of male terminal 11 and female terminal 21 is substantially negligible).

Furthermore, when the portion is water-cooled, and whether vehicle-side electric wire 3 may have a cross-sectional area of 70 mm$^2$ or 95 mm$^2$, it has been confirmed that the portion of vehicle-side electric wire 3 away from female terminal 21 by 100 cm is stable in temperature (or an effect of heat generated at the connecting portion of male terminal 11 and female terminal 21 is substantially negligible).

From the above results, it can be seen that, by setting electric wire 200 to have a length of 2 m or more, an effect of heat generated at a connecting portion of one male terminal 11 and one female terminal 21 on a connecting portion of the other male terminal 11 and the other female terminal 21 via the electric wire is negligible. Thus, in the present embodiment, electric wire 200 is set to have a length of 2 m or more.

Each crimp terminal 300 is connected to an end 210 of electric wire 200. Each crimp terminal 300 has a crimp portion 310 and a crimp-side flange 320.

Crimp portion 310 crimps end 210 of electric wire 200.

Crimp-side flange 320 is connected to crimp portion 310. Crimp-side flange 320 is formed flat. Crimp-side flange 320 is provided with an insertion hole (not shown). Crimp-side flange 320 is fixed to female-side flange 130 by a bolt B and a nut (not shown). Bolt B is inserted into insertion hole 130h of female-side flange 130 and the insertion hole of crimp-side flange 320.

Adjustment member 400 can adjust contact resistance of female terminal 100 and male terminal 11. Specifically, adjustment member 400 can apply an external force to each female terminal 100 to reduce each female terminal 100 in diameter. Adjustment member 400 includes an annular band 410, a metal band 420, and an adjustment unit 430.

Annular band 410 is attached around the plurality of contact pieces 110. Annular band 410 surrounds the entire circumference of the plurality of contact pieces 110. Annular band 410 is made of an electrically and thermally insulating material (resin or the like). In the direction parallel to center axis A, annular band 410 is smaller in length than slit 112S.

Metal band 420 is wrapped around annular band 410. Metal band 420 can apply an external force to the plurality of contact pieces 110 of female terminal 100 to reduce the plurality of contact pieces 110 in diameter.

Adjustment unit 430 can adjust a force applied by metal band 420 to clamp the plurality of contact pieces 110 (or reduce the plurality of contact pieces 110 in diameter). Specifically, adjustment unit 430 adjusts metal band 420 in diameter to adjust the clamping force. Adjustment unit 430 has a screw capable of adjusting metal band 420 in diameter.

A method for evaluating charging connector 5 in coolability by using evaluation jig 50 will now be described. Specifically, charging connector 5 is evaluated in coolability by connecting the pair of female terminals 100 of evaluation jig 50 to the pair of male terminals 11 of male connector 10. This evaluation method includes a removing step, a connecting step, an adjusting step, and an evaluating step.

Figure 14:
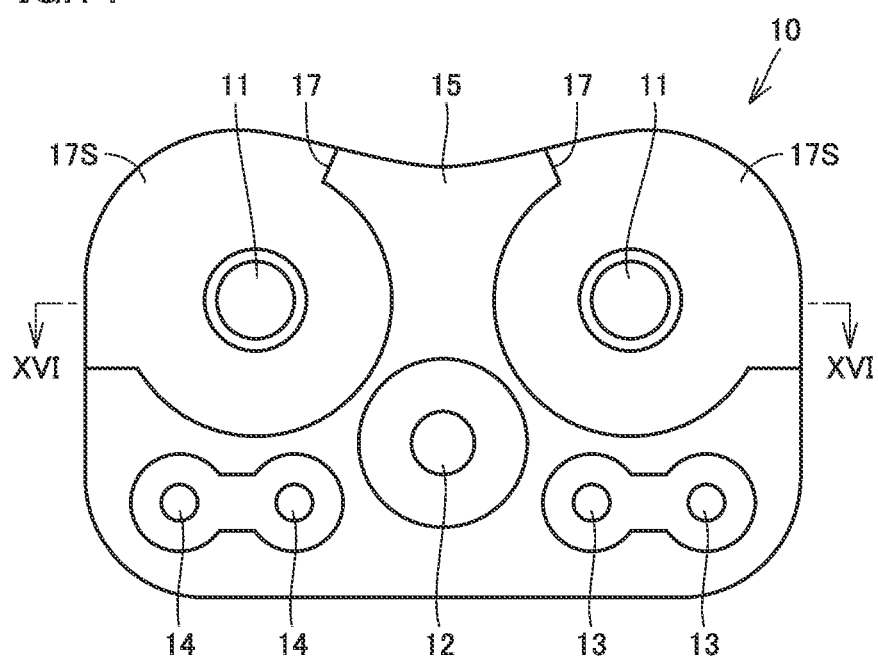
FIG. 14 is a front view of a male connector having a tubular wall partially removed.
Figure 15:
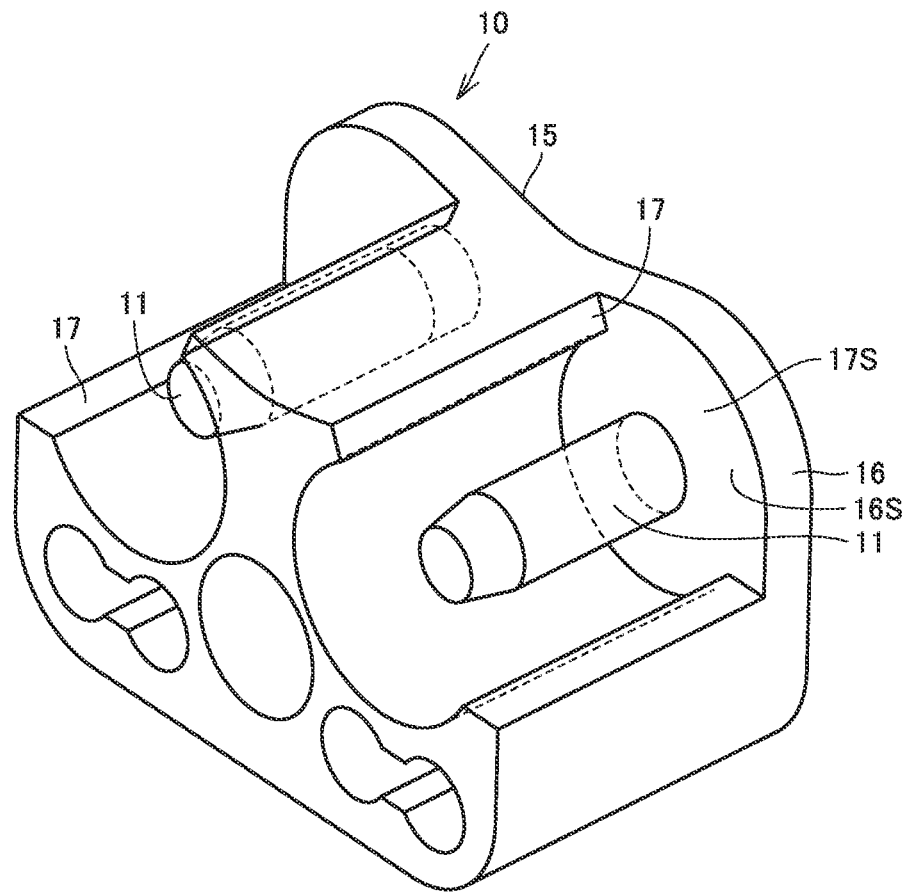
FIG. 15 is a perspective view of the male connector shown in FIG. 14.
Figure 16:
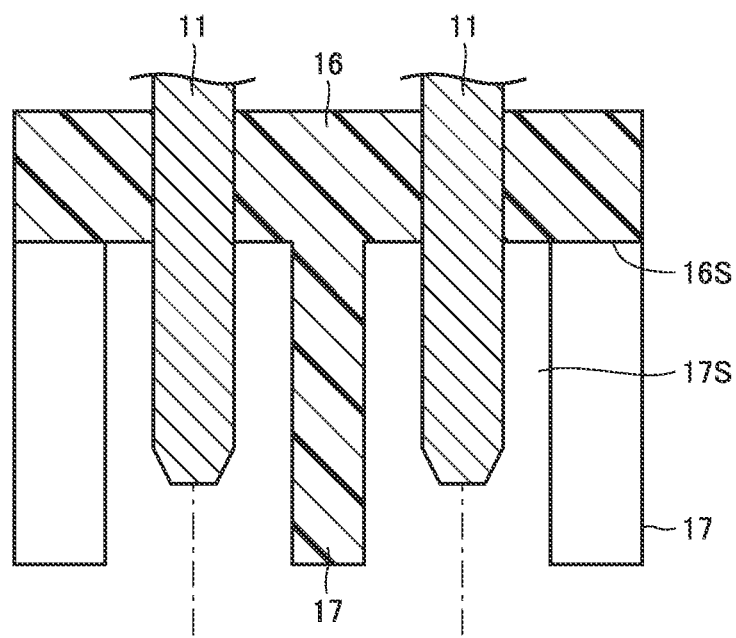
FIG. 16 is a cross section taken along a line XVI-XVI indicated in FIG. 14.

The removing step is a step of removing a portion of each tubular wall 17 of male casing 15. Specifically, as shown in FIGS. 14 to 16, in the removing step, each tubular wall 17 is partially removed to form around male terminal 11 an operating space 17S allowing an operation to be performed therein via adjustment unit 430 to adjust the external force. This partially exposes each male terminal 11. Thus, the removing step removes a portion other than a portion capable of suppressing a short circuit of male terminals 11 or male terminal 11 and other terminals 12 to 14, that is, a portion of tubular wall 17 where paired tubular walls 17 face each other. In the present embodiment, a portion of tubular wall 17 outside male terminal 11 in a direction of an imaginary line connecting male terminal 11 and protective grounding terminal 12 is removed.

Figure 17:
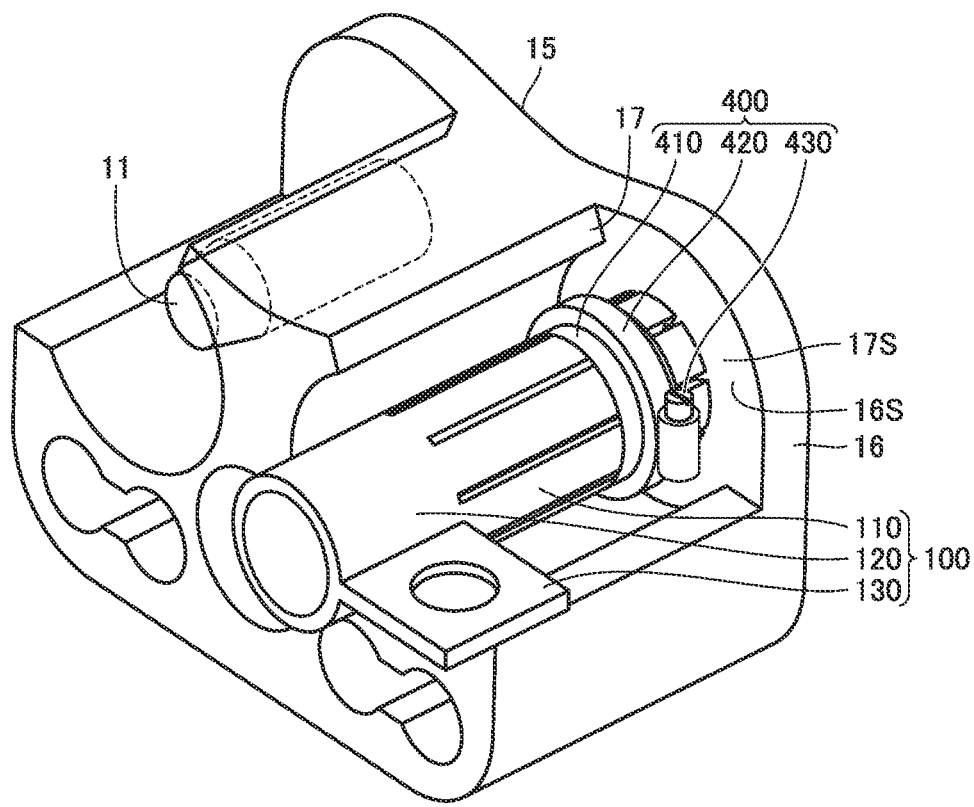
FIG. 17 is a perspective view showing a state in which the evaluation jig has a female terminal connected to a male terminal of the male connector shown in FIG. 15.
Figure 18:
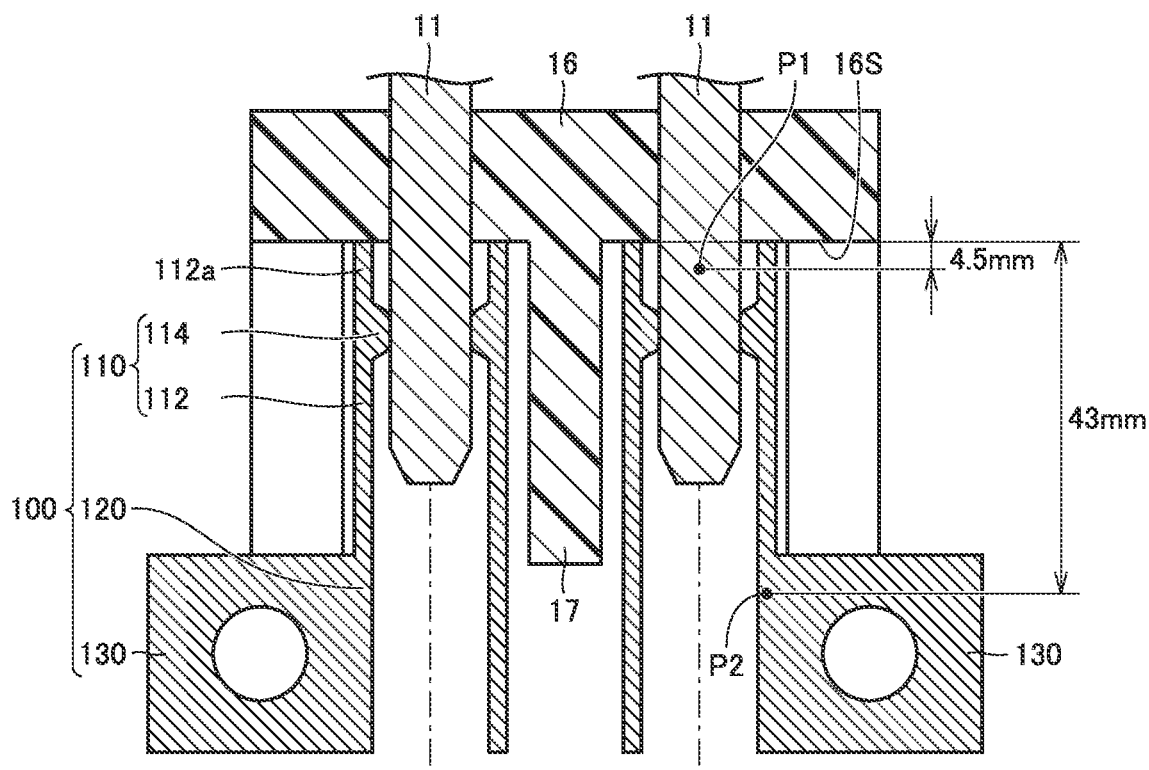
FIG. 18 is a cross section of the diagram shown in FIG. 17.

The connecting step is a step of connecting the pair of female terminals 100 of evaluation jig 50 to the pair of male terminals 11. In the connecting step, in a state in which each female terminal 100 has the plurality of contact pieces 110 with annular band 410 and metal band 420 attached thereto, female terminal 100 is connected to male terminal 11. As shown in FIGS. 17 and 18, in the connecting step, female terminal 100 is inserted until distal end portion 112a of each flexible piece 112 contacts surface 16S of bottom wall 16 of male casing 15. FIG. 17 shows one female terminal 100 alone receiving male terminal 11.

The adjusting step is a step of adjusting a connection state of male terminal 11 and female terminal 100. Specifically, in the adjusting step, the external force (the clamping force by metal band 420) is adjusted by adjustment unit 430. More specifically, in the adjusting step, the external force is adjusted by operating adjustment unit 430 with an operating tool (not shown) in operating space 17S so that contact resistance between male terminal 11 and female terminal 100 falls within a prescribed range. In this step, for example, from above in FIG. 17, the clamping force of adjustment unit 430 is adjusted with the operating tool.

In the adjusting step, the external force is preferably adjusted so that the contact resistance is 0.06 mΩ or more and 0.15 mΩ or less, more preferably 0.08 mΩ or more and 0.1 mΩ or less.

Herein, as shown in FIG. 18, the contact resistance is measured by a resistance value between a point P1 of 4.5 mm from surface 16S of bottom wall 16 and a point P2 of 43 mm from surface 16S of bottom wall 16. The contact resistance may be measured with a milliohm tester or may be determined by a voltage drop caused when a current of 400 A is supplied. Point P2 is in a vicinity of a boundary between a region affected by a standard applied in designing male connector 10 including male terminal 11 and a region unaffected thereby.

In the evaluating step, in a state with male terminal 11 and female terminal 100 connected together, a charging current of 400 A is supplied for 30 minutes, and the charging connector is evaluated in coolability by whether male terminal 11 and female terminal 100 have a temperature of 90° C. or lower. Whether male terminal 11 and female terminal 100 have such a temperature may be detected with a temperature sensor (not shown) provided to male terminal 11 or female terminal 100.

Thus, by using evaluation jig 50 of the present embodiment, an amount of heat generated when charging connector 5 has a current passing therethrough can appropriately be evaluated.

The exemplary embodiment described above is a specific example of the following aspect.

An evaluation jig of the above embodiment comprises a pair of female terminals connectable to a pair of male terminals of a charging connector, and an electric wire connecting the paired female terminals, the electric wire having a cross-sectional area of 70 mm$^2$ or more and 95 mm$^2$ or less and a length of 2 m or more.

The evaluation jig that comprises the electric wire having a cross-sectional area of 70 mm$^2$ or more and 95 mm$^2$ or less and a length of 2 m or more allows an appropriate evaluation of an amount of heat generated (or a degree at which temperature rise) at a connecting portion of a male terminal and a female terminal without being substantially affected by the electric wire's heat radiation characteristic when a current passes (or the evaluation is made). Each terminal can thus be designed based on a result of the evaluation.

Preferably, the electric wire is made of copper.

Furthermore, an evaluation jig comprises a pair of female terminals connectable to a pair of male terminals of a charging connector, and an adjustment member that can adjust contact resistance of the female terminal and the male terminal, wherein the female terminal can be reduced in diameter, the adjustment member includes an annular band attached to an outer peripheral surface of the female terminal and formed in an annular shape surrounding the female terminal, a metal band attached to an outer peripheral surface of the annular band and capable of applying an external force to the female terminal to reduce the female terminal in diameter, and an adjustment unit that can adjust the external force applied by the metal band to the female terminal, and the annular band is made of an electrically and thermally insulating material.

The evaluation jig that comprises the adjustment unit that can adjust the external (or clamping) force applied by the metal band to the female terminal can adjust contact resistance between the male terminal and the female terminal, and furthermore, the annular band disposed between the female terminal and the metal band that is made of an electrically and thermally insulating material can suppress heat radiation caused at the metal band or the adjustment unit, and hence reduction in accuracy in evaluating an amount of heat generated at a connecting portion of the male terminal and the female terminal.

An evaluation method of the above embodiment is an evaluation method performed by connecting to a charging connector including a pair of male terminals that can be cooled with a coolant an evaluation jig including a pair of female terminals connectable to the pair of male terminals, by connecting the pair of female terminals of the evaluation jig to the pair of male terminals of the charging connector, for evaluating the charging connector in coolability, the method comprising: connecting the pair of female terminals to the pair of male terminals; adjusting a connection state of the male terminal and the female terminal so that a contact resistance between the male terminal and the female terminal is 0.06 mΩ or more and 0.15 mΩ or less; and, after the step of adjusting, evaluating the coolability depending on whether the male terminal and the female terminal have a temperature of 90° C. or lower when a charging current of 400 A is supplied to the male terminal and the female terminal for 30 minutes.

In this evaluation method, contact resistance between the male terminal and the female terminal is defined to fall within a range of 0.06 mΩ or more and 0.15 mΩ or less, and variation in evaluation results is suppressed. Therefore, the charging connector's coolability can be appropriately evaluated. Further, designing the female terminal of the charging inlet such that the contact resistance is 0.06 mΩ or more and 0.15 mΩ or less allows the male terminal and the female terminal to have a temperature of 90° C. or lower when a charging connector which obtains a good evaluation result in the step of evaluating is used to charge power with a charging current of 400 A supplied for 30 minutes.

Preferably, in the step of adjusting, the connection state is adjusted so that the contact resistance is 0.08 mΩ or more and 0.1 mΩ or less.

Further, an evaluation method of the above embodiment is an evaluation method performed by connecting to a charging connector including a pair of male terminals that can be cooled with a coolant and a bottom wall that holds the pair of male terminals in a state in which the pair of male terminals are inserted therethrough an evaluation jig including a pair of female terminals connectable to the pair of male terminals, by connecting the pair of female terminals of the evaluation jig to the pair of male terminals of the charging connector, for evaluating the charging connector in coolability, the method comprising: connecting the pair of female terminals to the pair of male terminals; and adjusting a connection state of the male terminal and the female terminal so that contact resistance between the male terminal and the female terminal falls within a prescribed range, wherein in the step of adjusting, a resistance between a point of 4.5 mm of the male terminal from a surface of the bottom wall and a point of 43 mm of the female terminal from the surface of the bottom wall is measured as the contact resistance.

In this evaluation method, a measurement point for contact resistance between the male terminal and the female terminal is determined, and an appropriate evaluation result of the coolability can be obtained. Specifically, a measurement point on the side of the male terminal is a point of 4.5 mm from the surface of the bottom wall. At this point, the male terminal has a sufficiently large cross-sectional area, and an effect on the contact resistance is reduced. A measurement point on the side of the female terminal is a point of 43 mm from the surface of the bottom wall. This point is in a vicinity of a boundary of a region affected by a standard applied in designing the charging connector including the male terminal and a region unaffected by the standard. Therefore, designing the female terminal of the charging inlet to achieve contact resistance equal to or less than that measured at this point suppresses the male and female terminals' temperature to be a reference value or smaller when a charging connector that satisfies the standard is used to charge power.

Preferably, the evaluation method further comprises, after the step of adjusting, evaluating the coolability based on whether the male terminal and the female terminal have a temperature equal to or lower than 90° C. when a charging current of 400 A is supplied to the male terminal and the female terminal for 30 minutes.

Furthermore, an evaluation jig of the above embodiment includes a pair of female terminals connectable to a pair of male terminals of a charging connector, and an adjustment member that can adjust contact resistance of the female terminal and the male terminal, wherein the female terminal can be reduced in diameter, and the adjustment member can apply an external force to the female terminal to reduce the female terminal in diameter.

In this evaluation jig, the female terminal can be reduced in diameter and the adjustment member can apply an external force to the female terminal to reduce the female terminal in diameter, and contact resistance of the male terminal and the female terminal can be adjusted to fall within a prescribed range. Thus, the charging connector's coolability can be appropriately evaluated.

Furthermore, an evaluation method of the above embodiment is a method performed by connecting to a charging connector including a pair of male terminals that can be cooled with a coolant and a pair of tubular walls surrounding each of the paired male terminals an evaluation jig including a pair of female terminals that can be connected to the pair of male terminals and reduced in diameter and an adjustment member that can apply an external force to each of the paired female terminals to reduce the female terminal in diameter, by connecting the pair of female terminals of the evaluation jig to the pair of male terminals of the charging connector, for evaluating the charging connector in coolability, the method comprising: partially removing each tubular wall of the paired tubular walls to form around the male terminal an operating space allowing an operation to be performed therein via the adjustment member to adjust the external force; connecting the pair of female terminals to the pair of male terminals; and adjusting the external force in the operating space by the adjustment member so that contact resistance between the male terminal and the female terminal falls within a prescribed range.

In this evaluation method, an operating space allowing an operation to be performed therein to adjust external force is formed around a male terminal, and contact resistance can be adjusted in a state with the evaluation jig having a female terminal connected to the male terminal.

In the step of removing, the tubular wall preferably has removed a portion other than a portion at which the paired tubular walls face each other.

This suppresses short circuit of the male terminals.

Further, the adjustment member may include an annular band that is attached to an outer peripheral surface of the female terminal and formed in an annular shape surrounding the female terminal, a metal band that is attached to an outer peripheral surface of the annular band and can apply a force to the female terminal to reduce the female terminal in diameter, and an adjustment unit that can adjust a force applied by the metal band to clamp the female terminal, and the annular band may be made of an electrically and thermally insulating material. In this case, preferably, in the step of connecting, the pair of female terminals is connected to the pair of male terminals in a state with the annular and metal bands attached to each female terminal, and in the step of adjusting, the force applied by the metal band to clamp the female terminal is adjusted in the operating space.

Furthermore, an evaluation jig of the above embodiment comprises a female terminal connectable to a male terminal of a charging connector, the female terminal including a plurality of contact pieces which can each contact the male terminal and are spaced about a center axis, and a support portion to support the plurality of contact pieces, the plurality of contact pieces each having a flexible piece having a shape extending from the support portion in a direction parallel to the center axis, and a contact portion protruding toward the center axis from an inner surface of the flexible piece, the flexible piece forming a portion of a cylinder having the center axis, the flexible piece having a length equal to or larger than twice an outer diameter of the cylinder in a direction parallel to the center axis, the flexible piece being elastically deformable so that the flexible piece has a distal end portion to be displaceable in a radial direction of the cylinder relative to a proximal end portion of the flexible piece serving as a connecting portion of the flexible piece and the support portion, the contact portion having a shape curved so as to protrude inward in the radial direction.

In this evaluation jig, the flexible piece that has a length equal to or larger than twice the outer diameter of the cylinder in the direction parallel to the center axis is each less plastically deformable when the female terminal is repeatedly connected to and pulled out of the male terminal, and furthermore, each contact portion having a shape curved so as to protrude inward in the radial direction reliably contacts the male terminal. This allows prescribed contact resistance to be reliably reproduced and the charging connector's coolability to be evaluated appropriately.

Preferably, the contact portion has a shape extending in a direction parallel to the center axis.

Thus, even when the female terminal is connected to the male terminal in a state with the female terminal's center axis inclined relative to the male terminal's center axis, the female terminal is guided to have a posture so that the center axes match each other.

Preferably, the flexible piece has a protruding portion protruding from the contact portion in a direction parallel to the center axis away from the support portion.

Preferably, the flexible piece and the contact portion have a boundary portion therebetween in a curved shape.

In this case, the contact portion preferably has an apex smaller in curvature than the boundary portion.

Furthermore, preferably, the flexible piece has a facing surface facing a flexible piece adjacent to the flexible piece of interest in the circumferential direction of the cylinder, and any pair of such facing surfaces facing each other in the circumferential direction are parallel to each other.

It should be understood that the presently disclosed embodiments are illustrative and not restrictive in any respect. The scope of the present invention is defined by the terms of the claims and intended to encompass any modifications within a meaning and scope equivalent to the terms of the claims.

What is claimed is:

1. A reference jig comprising
a reference terminal connectable to a male terminal of a connector, the reference terminal including
a plurality of pieces, each of which has a shape that is spaced about a center axis and extends along the center axis, and
a plurality of convex portions each protruding toward the center axis from an inner surface of one of the plurality of pieces,
each piece of the plurality of the pieces having an outer peripheral surface composed of an arc surface centered on the center axis,
the piece having a length four times or more a radius of curvature of the arc surface in a direction parallel to the center axis,
the convex portion having a shape curved so as to protrude inward in a radial direction of the outer peripheral surface of the piece,
the convex portion including
an inner edge with a shape extending along the direction parallel to the center axis, and
a connecting portion connecting the inner edge to the inner surface of the piece,
the connecting portion having a shape that is inclined so as to gradually approach the inner surface of the piece as it is separated from the inner edge in the direction parallel to the center axis.

2. The evaluation jig according to claim 1, wherein a radius of curvature of a boundary portion between the inner edge and the connecting portion is larger than a radius of curvature of a boundary portion between the connecting portion and the inner surface of the piece.

3. The evaluation jig according to claim 1, wherein the radius of curvature of the boundary portion between the connecting portion and the inner surface of the piece is 0.5 mm.

4. The evaluation jig according to claim 1, wherein the reference terminal further has a cylindrical portion connected to the plurality of pieces and formed in a cylindrical shape centered on the center axis.

5. The evaluation jig according to claim 4, wherein
the reference terminal further has a flange connected to the cylindrical portion,
the flange has a shape that projects outward from the outer peripheral surface of the cylindrical portion in a direction orthogonal to the center axis.

6. The evaluation jig according to claim 5, wherein a length of the flange in the direction parallel to the center axis is the same as a length of the cylindrical portion in the direction parallel to the center axis.

7. The evaluation jig according to claim 5, wherein the flange is provided with an insertion hole.

* * * * *